United States Patent [19]

Martin et al.

[11] Patent Number: 4,489,480
[45] Date of Patent: Dec. 25, 1984

[54] METHOD OF MANUFACTURING FIELD EFFECT TRANSISTORS OF GAAS BY ION IMPLANTATION

[75] Inventors: Gérard M. Martin, Paris; Shérif Makram-Ebeid, Limeil-Brevannes; Camille Venger, Montfermeil, all of France

[73] Assignee: U.S. Philips Corporation, New York, N.Y.

[21] Appl. No.: 480,445

[22] Filed: Mar. 30, 1983

[30] Foreign Application Priority Data

Apr. 9, 1982 [FR] France ............... 82 06290

[51] Int. Cl.³ .................... H01L 21/263; H01L 27/12
[52] U.S. Cl. .................... 29/576 B; 29/571; 148/1.5; 148/187; 357/23; 357/65; 357/91
[58] Field of Search ............... 29/576 B, 571; 148/1.5, 148/187; 357/91, 23, 61, 65

[56] References Cited

U.S. PATENT DOCUMENTS

| | | | |
|---|---|---|---|
| 4,033,788 | 7/1977 | Hunsperger et al. | 148/1.5 |
| 4,357,180 | 11/1982 | Molnar | 148/1.5 |
| 4,366,493 | 12/1982 | Braslau et al. | 357/65 |
| 4,385,938 | 5/1983 | Park et al. | 148/1.5 |
| 4,389,768 | 6/1983 | Fowler et al. | 29/571 |
| 4,396,437 | 8/1983 | Kwok et al. | 148/1.5 |

OTHER PUBLICATIONS

Favennec et al., in Ion Implan. in Semiconductors-ed. Crowder, Plenum, N.Y. 1973, p. 621.
Okamura et al., Appl. Phys. Lett. 40 (1982) 689.
Kung et al., Electronics Lett. 13 (1977) pp. 187-188.

Primary Examiner—Upendra Roy
Attorney, Agent, or Firm—Paul R. Miller

[57] ABSTRACT

The invention relates to a method of manufacturing field effect transistors of gallium arsenide obtained by ion implantation of light donors, such as silicon or selenium, in a semi-insulating substrate of gallium arsenide. In order to reduce out-diffusion of the deep level ($EL_2$) responsible for parasitic phenomena in the operation of the transistors, the method is characterized in that in addition oxygen ions are implanted in at least the region of the substrate intended to form the channel region of the field effect transistor. After implantation, the substrate is sintered at a temperature between 600° and 900° C. in either an enveloping substance or uncovered, and/or in an atmosphere of arsine.

12 Claims, 4 Drawing Figures

METHOD OF MANUFACTURING FIELD EFFECT TRANSISTORS OF GAAS BY ION IMPLANTATION

BACKGROUND OF THE INVENTION

The invention relates to a method of manufacturing a field effect transistor in a layer of gallium arsenide of the n-type on a semi-insulating substrate of gallium arsenide. The invention further relates to field effect transistors obtained by the use of this method.

Such a method is known from the French patent application published under No. 2,496,982 on June 25, 1982.

The invention relates to the manufacture of integrated circuits, more particularly in gallium arsenide. The essential standard element of these circuits is the field effect transistor, the gate electrode of which frequently is a metallic electrode in contact with a semiconductor layer forming a so-called Schottky junction.

Micro-electronics having for its object to reduce the volume and weight for applications in which such a reduction is fundamental, i.e. in the field of aerospace, this reduction necessarily results in a gradually advancing integration of the circuits. However, anomalies in the performance of the transistors limit the efficiency of manufacture of these circuits and counteract the improvement of the integration level.

Among these anomalies there are two particular ones, which seem to be the least understandable and the most disturbing ones. These are the phenomena of control by the substrate (so-called "back-gating") and anomalies of the drain-source characteristics $I_{DS}$-$V_{DS}$ (so-called "bumping").

The first phenomenon consists in the possibility of controlling the channel of a field effect transistor (FET) from an electrode adjacent to, but foreign to the transistor, which electrode is subjected to a negatvie potential with respect to the source of this transistor. This type of anomaly is known in field-effect transistors obtained by epitaxy and a solution for this problem consists in that a weakly conducting buffer layer is provided which separates the channel of the transistor from the semi-insulating substrate. This solution is not transposable here because the technology used for the manufacture of the transistors consists in direct ion implantation(s) in a semi-insulating GaAs substrate.

The second phenomenon consists in an abrupt increase of the drain current starting at a certain "threshold voltage" between drain and source. The reason for this phenomenon seems to be closely associated with the phenomenon of control by the substrate because the two pheonomena occur concomitently in the same field effect transistor.

FIELD OF THE INVENTION

The invention has for its object to mitigate these various disadvantages by providing a novel manufacturing method in which these parasitic phenomena are reduced.

The manufacturing method according to the present invention is characterized in that an n-type gallium arsenide layer is obtained by donor ion implantation in the semi-insulating substrate of gallium arsenide, and in that in addition oxygen ions are implanted at least in the region of the substrate intended to form the channel region of the field effect transistor.

DESCRIPTION OF THE PRIOR ART

According to the prior art, semiconductor devices, such as field effect transistors, were usually obtained by epitaxial growth and self-alignment.

Epitaxy is the process of oriented growth of a monocrystalline layer on a likewise monocrystalline substrate. More particularly, it is possible with this process to deposit one layer (or several layers) of accurately controlled thickness and doping on a substrate of lower quality, for example, a wafer cut from a massive block of a semiconductor material, such as gallium arsenide.

Subsequently, for example, with the so-called self-alignment technology suitable for the manufacture of Schottky gate field effect transistors, such as disclosed in French patent specification No. 1,437,781 filed in the name of N. V. Philips Gloeilampenfabrieken, the main steps are:

(a) deposition of a metal layer for the gate electrode;
(b) deposition of a photoresist layer and illumination with ultraviolet radiation through a mask defining the gate electrode;
(c) etching of the metal layer and underetching of the semiconductor material by means of a suitable solution;
(d) deposition of a metal layer forming ohmic source and drain electrodes on the semiconductor material by using the shadow effect obtained by the underetching in the preceding step.

Various modifications and improvements are known, and are described here in greater detail, but they are not relevant to the invention.

During the manufacture of integrated circuits having a plurality of field effect transistors on one substrate, from a given degree of integration anomalies in the operation appear which are comparatively disturbing and of which two particular ones have been mentioned above, i.e. control by the substrate (back-gating) and anomalies of the $I_{DS}$-$V_{DS}$ characteristics. These types of anomalies have been examined in transistors obtained by epitaxy and in this connection reference is made to the article published in I.E.E.E. Transactions on Electronic Devices, ED-27, 1037 (1980) by T. ITHO and H. YANAI, in which it is concluded that deep levels play an important part in the occurrence of these anomalies.

The solution found for this type of transistor (weakly conducting buffer layer) not being applicable in the case of transistors obtained by direct ion implantation(s) in a semi-insulating substrate, in experiments leading to the invention, the problem of deep levels in semi-insulating substrates was examined more precisely, and a model of the disturbance mechanism by adjacent electrodes was developed suitable to ensure a clear understanding of these phenomena and to develop a method in which the aforementioned disadvantages are obviated.

One of the first steps of this fundamental examination has been made by G. M. MARTIN, A. MITONNEAU and A. MIRCEA and published in "Electronics Letters" of Mar. 31, 1977, vol. 13, No. 7, pp. 191-193 in the article entitled "Electron traps in bulk and epitaxial GaAs crystals". This examination has for its object especially to indicate the different levels of electron traps, to characterize them and to make an inventory thereof as a function of, for example, their activation energy.

A second step consisted in trying to understand the compensation mechanisms which render a material semiinsulating. The article entitled "Compensation mechanisms in GaAs" by G. M. MARTIN, J. P. FARGES, G. JACOB, J. P. HALLAIS and G. POIBLAUD published in J. Applied Physics (51), May 5, 1980, pp. 2840-2852 typically mentions the actual knowledge of this mechanism; it concludes that the compensation originates from two deep levels, i.e. a first deep donor level $EL_2$ ($E_C$-0.75 eV) and a second deep acceptor level relating to chromium in the case of solid gallium arsenide material intentionally doped with chromium in concentrations that may vary between $6.10^{15}$ and $4.10^{17}$ cm$^{-3}$. The Shockley diagrams then permit of deriving from the acceptor and donor levels the position of the Fermi level $E_F$ which, as is known, is situated at the center of the forbidden band for semi-insulating materials and hence is strongly dependent upon the two aforementioned deep levels.

Mention should be made of what in the following description is meant by outdiffusion and the disadvantages associated therewith. The expression "outdiffusion" means that after a heat treatment the density of the level decreases at the surface of the material, but remains substantially constant in its bulk. The level $EL_2$ being a deep donor level ($E_C$-0.75 eV), its outdiffusion consequently leads to a conversion at its surface into p-type material. Now, when semiconductor devices of the FET type are realized in GaAs, donors (Se$^+$ or Si$^+$) are implanted so that a layer of the n-conductivity type is obtained, but the implantation depth - approximately 150 nm - is considerably smaller than the distance of the conversion - approximately 1000 nm - and consequently a parasitic junction is obtained at the back of the device, which parasitic junction seems to be responsible for the anomalies of parasitic control by the adjacent electrodes.

SUMMARY OF THE INVENTION

Consequently, according to the invention, a method is developed of treating the region of the substrate intended to form the gate region of the FET which method permits of counteracting the outdiffusion of the level $EL_2$ so that the extent of the conversion and hence the parasitic phenomena of back-gating are reduced.

According to the invention, a n-type gallium arsenide layer is obtained by donor ion implantation in a semi-insulating GaAs substrate, and in addition oxygen ions are implanted at least in the region of the substrate intended to form the channel region of the field effect transistor.

In fact, it appears from experiments carried out in accordance with the present invention that the implantation of oxygen counteracts to a considerable extent outdiffusion of the level $EL_2$. Moreover, this outdiffusion being very large in the type of material used, when this outdiffusion is counteracted, the distance between the various materials thus implanted is reduced, and consequently the manufacturing technology is rendered more reproducible.

The method of manufacturing field effect transistors according to the invention will now be described with reference to accompanying figures.

DESCRIPTION OF THE PREFERRED EMBODIMENTS

Figure 1:
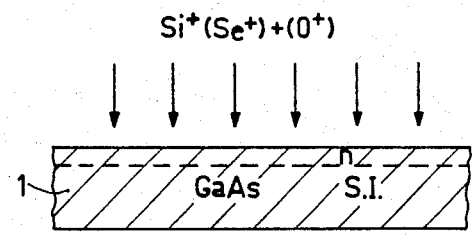
FIGS. 1 and 2 show the steps of ion implantation in a substrate of GaAs.

FIG. 1 shows a semi-insulating substrate of GaAs 1 obtained by cutting a wafer from an ingot, such as obtained by crystal pulling. In this substrate, donor atoms, such as silicon (Si$^+$) or selenium (Se$^+$) are implanted so that a layer of the n-conductivity type is obtained. According to the invention, oxygen (O$^+$) is then further implanted with the implantation conditions depending upon the nature of the preceding implant:

(a) In the case of implantation of selenium (Se$^+$) and of oxygen (O$^+$), these elements are implanted in the same area, for example at the energies and doses of Se$^+$: (280 keV; $3.10^{12}$ cm$^{-2}$) and O$^+$: (100 keV; from $5.10^{11}$ to $5.10^{13}$ cm$^{-2}$);

(b) in the case of implantation of silicon (Si$^+$) and of oxygen (O$^+$), the former (Si$^+$) is implanted at several energies so that a very thick layer is obtained, for example, Si$^+$: 60 keV, 200 keV and 400 keV, and the latter (O$^+$) is implanted at a comparatively high energy so that it is implanted to a comparatively large depth, for example, O$^+$: 200 keV, the doses being substantially the same as those mentioned above.

In fact, within the scope of the present invention, the implantation of oxygen ions (O$^+$) is effected in the region intended to become the gate region, while moreover if the other implant is silicon (Si$^+$), the implantation energy is chosen so that the oxygen implanted region is comparatively deep (for example, to a depth between 400 nm and 800 nm), the silicon (Si$^+$) implants being distributed in a layer having a comparatively large thickness (for example, from the surface to 1000 nm) which at least partly covers the first-mentioned region.

Figure 2:
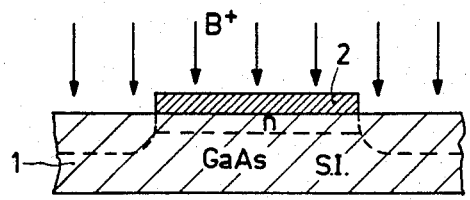

FIG. 2 shows the step of insulating the essential elements by islands. This step is effected according to a known ion implantation technique of implanting boron (B$^+$) ions, the zones to be protected being coated, for example, with a photoresist layer 2 of a few microns thickness.

These ion implantation are then followed by a thermal treatment in an enveloping substance, for example in silicon nitride, at a temperature between 800° C. and 900° C. for a time of the order of 15 minutes. This sintering step is necessary in order to recover the implantation defects and to move the ions introduced into the crystalline matrix to substitutional sites. This sintering step is further important because it modifies the concentration profiles and especially the outdiffusion of the deep levels, such as $EL_2$, or that of chromium (Cr). According to a modification, the sintering step can be effected in an atmosphere of arsine (AsH$_3$), the substrate being uncovered.

The results obtained for the experiments carried out in the present invention after implantation of oxygen are very interesting: the outdiffusion of $EL_2$ takes place much less rapidly than that observed for the same level with conventional sintering steps in an enveloping substance.

Figure 3:
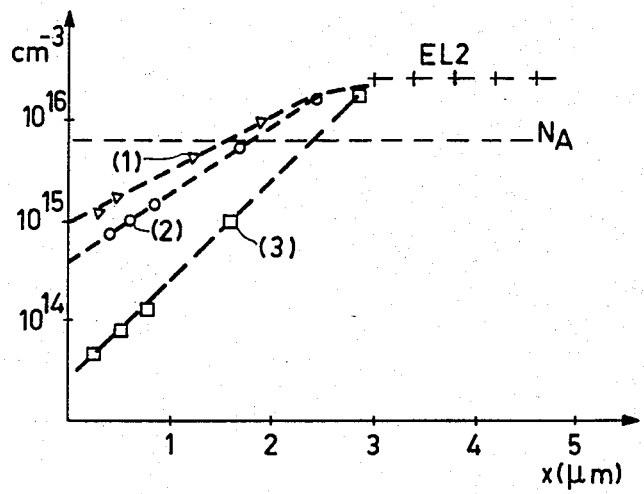
FIG. 3 shows the concentration profiles of a deep level ($EL_2$) after sintering according to the prior art, and according to the present invention, for comparison.

FIG. 3 shows the concentration profile (x being the distance from the surface) of the level $EL_2$ in a substrate of GaAs. The curves (1 and 2) show this profile in a substrate of the n-type obtained by ion implantation of Se$^+$($3.5 \cdot 10^{12}$ cm$^{-2}$, 280 keV) and of O$^+$($10^{14}$ cm$^{-2}$ for the curve 1, $10^{13}$ cm$^{-2}$ for the curve 2 at 100 keV) and sintered at 870° C. under Si$_3$N$_4$. The curve (3) shows this profile for the same kind of substrate without implantation of oxygen. N$_A$ is the acceptor density.

Figure 4:
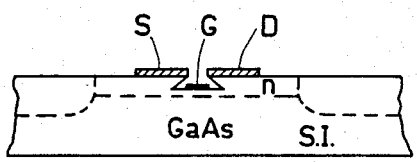
FIG. 4 shows the manufacture of the field effect transistors (FET's) on the substrate obtained after the treatment in accordance with the present invention.

FIG. 4 shows the formation of the fundamental elements (FET's) according to a likewise known technology, for example, that known from the French patent application filed in the name of the Applicant and published under No. 2,496,982, which permits of obtaining gates in the submicron range without a mask in the submicron range, by under-etching of the drain electrode, on the understanding that any other compatible technology may also be used.

It will be clear to those skilled in the art that numerous modifications are possible without departing from the scope of the invention.

What is claimed is:

1. A method of manufacturing a field effect transistor comprising the steps of
   providing a semi-insulating substrate of gallium arsenide,
   forming a layer of n-type gallium arsenide on said substrate by implanting donor ions into said substrate, and
   implanting oxygen ions at least in a region of said substrate where a channel region of said field effect transistor is formed.

2. A method according to claim 1, wherein said donor ions are selenium ions, and wherein said oxygen ions are implanted to approximately the same depth as said selenium ions.

3. A method as claimed in claim 1, wherein said donor ions are silicon ions implanted at several energies, said silicon ions being distributed to a depth of 1000 nm, and wherein said oxygen ions are implanted at a high energy to a depth between 400 and 800 nm.

4. A method according to claim 1, wherein after said ion implantations said substrate is subjected to a thermal treatment at a temperature between approximately 600° C. and 900° C. for 15 minutes.

5. A method according to claim 2, wherein after said ion implantations said substrate is subjected to a thermal treatment at a temperature between approximately 600° C. and 900° C. for 15 minutes.

6. A method according to claim 5, wherein during said thermal treatment said substrate is enveloped in silicon nitride.

7. A method according to claim 5, wherein said thermal treatment is effected in an atmosphere of arsine (AsH$_3$), and wherein said substrate is uncovered.

8. A method according to claim 3, wherein after said ion implantations said substrate is subjected to a thermal treatment at a temperature between approximately 600° C. and 900° C. for 15 minutes.

9. A method according to claim 8, wherein during said thermal treatment said substrate is enveloped in silicon nitride.

10. A method according to claim 8, wherein said thermal treatment is effected in an atmosphere of arsine (AsH$_3$), and wherein said substrate is uncovered, 11. A method according to claim 4, wherein during said thermal treatment said substrate is enveloped in silicon nitride.

12. A method according to claim 4, wherein said thermal treatment is effected in an atmosphere of arsine (AsH$_3$), and wherein said substrate is uncovered.

* * * * *